United States Patent
Lin et al.

(10) Patent No.: US 9,299,722 B2
(45) Date of Patent: Mar. 29, 2016

(54) DISPLAY PANEL AND ACTIVE DEVICE THEREOF

(71) Applicant: Au Optronics Corporation, Hsinchu (TW)

(72) Inventors: Wei-Li Lin, Hsinchu (TW); Ming-Yen Tsai, New Taipei (TW); Yi-Suei Liao, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/277,073

(22) Filed: May 14, 2014

(65) Prior Publication Data

US 2015/0228673 A1   Aug. 13, 2015

(30) Foreign Application Priority Data

Feb. 10, 2014   (TW) .............................. 103104282 A

(51) Int. Cl.
*H01L 27/12*   (2006.01)

(52) U.S. Cl.
CPC ........ *H01L 27/1222* (2013.01); *H01L 27/1255* (2013.01)

(58) Field of Classification Search
CPC .................. H01L 29/78696; H01L 29/41733; H01L 29/78618; H01L 27/1214; G02F 1/1368; G02F 1/362; G02F 1/134363
USPC ....................................................... 257/71, 72
See application file for complete search history.

(56) References Cited

U.S. PATENT DOCUMENTS

2006/0049404 A1* 3/2006 Park et al. ........................ 257/59
2006/0146218 A1* 7/2006 Her et al. ......................... 349/43

FOREIGN PATENT DOCUMENTS

| CN | 201956353 | 8/2011 |
| TW | 200638090 | 11/2006 |

* cited by examiner

*Primary Examiner* — Trung Q Dang
(74) *Attorney, Agent, or Firm* — Jianq Chyun IP Office

(57) ABSTRACT

A display panel and an active device thereof are provided. The active device includes a gate, a semiconductor layer, a first source and a plurality of first drains. The first source includes a first side and a second side opposite to each other, the first side has a plurality of first recesses, and the second side has a plurality of second recesses. Each of the first recesses and a corresponding second recess are disposed opposite to each other to constitute a recess-pair. A minimum distance between the first recess and the second recess of each recess-pair is A, a minimum distance between two neighboring recess-pairs is B, wherein A is greater than B. The first drains are electrically connected to each other, and each of the first drains is respectively disposed in one of the recesses of the first source.

17 Claims, 8 Drawing Sheets

DISPLAY PANEL AND ACTIVE DEVICE THEREOF

CROSS-REFERENCE TO RELATED APPLICATION

This application claims the priority benefit of Taiwan application serial no. 103104282, filed on Feb. 10, 2014. The entirety of the above-mentioned patent application is hereby incorporated by reference herein and made a part of this specification.

BACKGROUND OF THE INVENTION

1. Field of the Invention

The invention generally relates to a display panel and an active device thereof, and more particularly, to an active device used in a driving circuit of a display panel.

2. Description of Related Art

With the evolution of optoelectronics and semiconductor technology, it has brought great flourish of display panels. Among many displays, the flat panel display has recently been widely used to replace cathode ray tube display and play the major role for the next-generation displays. Taking the liquid crystal display panel (LCD panel) as an example, a driving circuit of a display panel includes an active device to receive the signal from a driver IC and then transmit the signal to a pixel array.

Since the active device of the driving circuit needs to transmit the signal to the pixel array comprising a plurality of pixel active devices and pixel electrodes, the active device of the driving circuit will carry a considerable current, which easily generates a large internal current density in the active device, so that the active device suffers a noticeable stress effect and the stability of the active device is deteriorated. Once the active device gets damaged, the entire display panel may fail to operate normally. Therefore, how to enhance the stability and the lifetime of the active device has become an important issue.

SUMMARY OF THE INVENTION

Accordingly, the present invention provides a display panel and an active device thereof, wherein the internal current density of the active device can be effectively reduced. Furthermore, the heat-dissipating area of the active device can be increased. As a result, the stability and the lifetime of the active device are enhanced.

According to an embodiment of the invention, a display panel including a pixel array and a driving circuit is provided. The driving circuit is electrically connected to the pixel array, wherein the driving circuit includes at least one active device and the active device includes a gate, a semiconductor layer, a first source and a plurality of first drains. The semiconductor layer is disposed over the gate. The first source is disposed on the semiconductor layer and includes a first side and a second side opposite to each other, wherein the first side has a plurality of first recesses, the second side has a plurality of second recesses, each of the first recesses and a corresponding second recess are disposed opposite to each other to constitute a recess-pair, a minimum distance between the first recess and the second recess of each recess-pair is A, a minimum distance between two neighboring recess-pairs is B, wherein A is greater than B. The first drains are disposed on the semiconductor layer and are electrically connected to each other. Each of the first drains is respectively disposed in one of the recesses of the first source.

According to an embodiment of the invention, an active device including a gate, a semiconductor layer, a first source and a plurality of first drains is provided. The semiconductor layer is disposed over the gate. The first source is disposed on the semiconductor layer and includes a first trunk and a plurality of first branches. The first branches are respectively disposed at two sides of the first trunk to form a plurality of recesses, wherein the width of the first trunk is A, the width of each the first branch is B, and A is greater than B. The first drains are disposed on the semiconductor layer, wherein the first drains are electrically connected to each other, and each of the first drains is respectively disposed in one of the recesses of the first source.

Based on the an embodiment of the invention, the source in the active device includes a trunk and a plurality of branches disposed at two sides of the trunk to form the recesses, and the width of the trunk of the source in the active device is greater than the width of the branch, so that when the current passes through the active device, the internal current density of the active device can be effectively reduced, which reduces the stress effect and the thermal effect of the display device and enhances the stability and the lifetime of the active device.

In order to make the features and advantages of the present invention more comprehensible, the present invention is further described in detail in the following with reference to the embodiments and the accompanying drawings.

DESCRIPTION OF THE EMBODIMENTS

Figure 1:
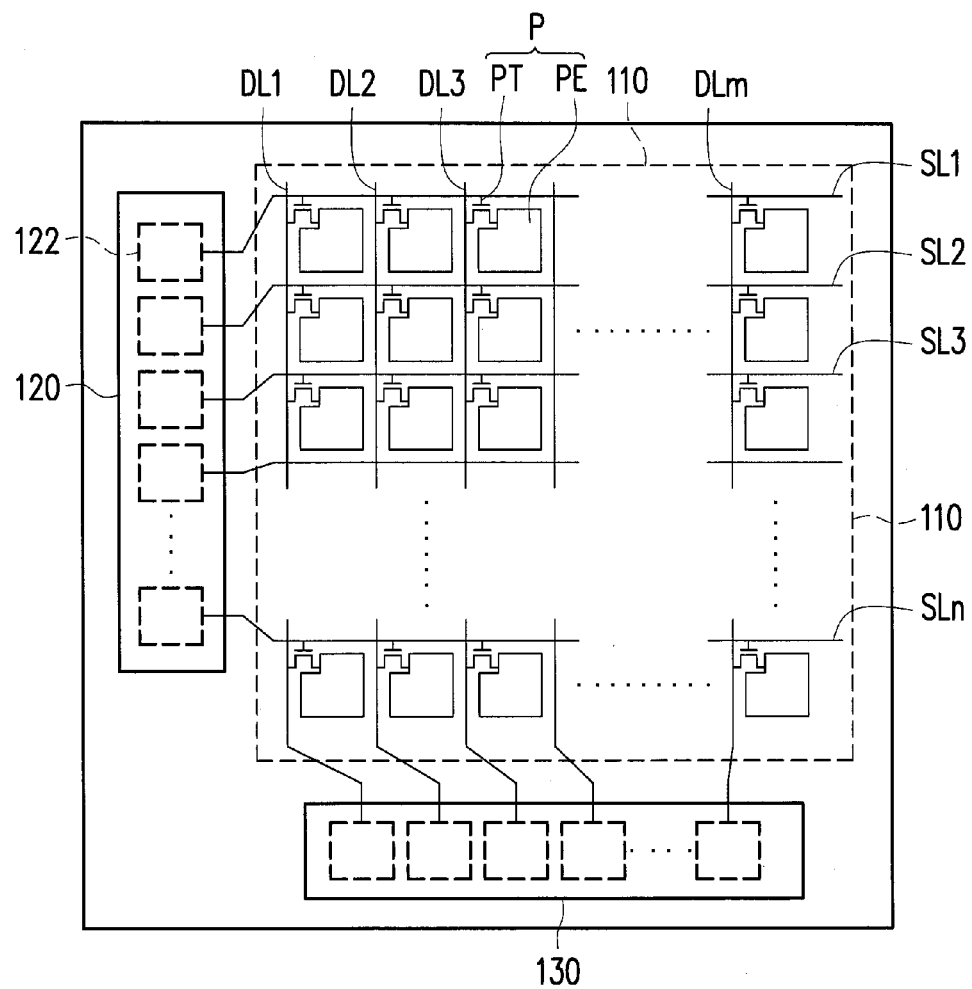
FIG. 1 is a top-view diagram of a display panel according to an embodiment of the invention.

FIG. 1 is a top-view diagram of a display panel according to an embodiment of the invention. Referring to FIG. 1, a display device 100 includes a pixel array 110, a gate driving circuit 120 and a source driving circuit 130. The gate driving circuit 120 and the source driving circuit 130 are respectively electrically connected to the pixel array 110.

The pixel array 110 includes a plurality of scan lines SL1-SLn, a plurality of data lines DL1-DLm and a plurality of pixel structures P.

The scan lines SL1-SLn and the data lines DL1-DLm are intersected, and an insulation layer is disposed between the scan lines SL1-SLn and the data lines DL1-DLm. In other words, the extending direction of the scan lines SL1-SLn and the extending direction of the data lines DL1-DLm are not parallel to each other, and preferably, the extending direction of the scan lines SL1-SLn are perpendicular to the extending direction of the data lines DL1-DLm. Considering the conductivity, the scan lines SL1-SLn and the data lines DL1-DLm are made of metallic materials. However, the materials of the scan lines SL1-SLn and the data lines DL1-DLm are not limited to metal. Other conductive materials, for example, alloy, metal nitride material, metal oxide material, metal nitrogen oxide material, other suitable materials, or stacked layer of metal material and other conductive material can be used to form the scan lines SL1-SLn and the data lines DL1-DLm.

The pixel structure P includes a pixel active device PT and a pixel electrode PE. The pixel active device PT can be a bottom-gate thin film transistor (TFT) or a top-gate TFT, which includes a gate, a channel, a source and a drain. The pixel active device PT is electrically connected to one of the scan lines SL1-SLn and one of the data lines DL1-DLm correspondingly. In addition, the pixel active device PT is electrically connected to the pixel electrode PE.

The gate driving circuit 120 is electrically connected to the pixel array 110. The gate driving circuit 120 includes a plurality of gate driving units 122, and each of the gate driving units 122 is electrically connected to one of the scan lines SL1-SLn. In addition, the source driving circuit 130 is electrically connected to the pixel array 110. The gate driving units 122 in the gate driving circuit 120 are further described as following.

Figure 2:
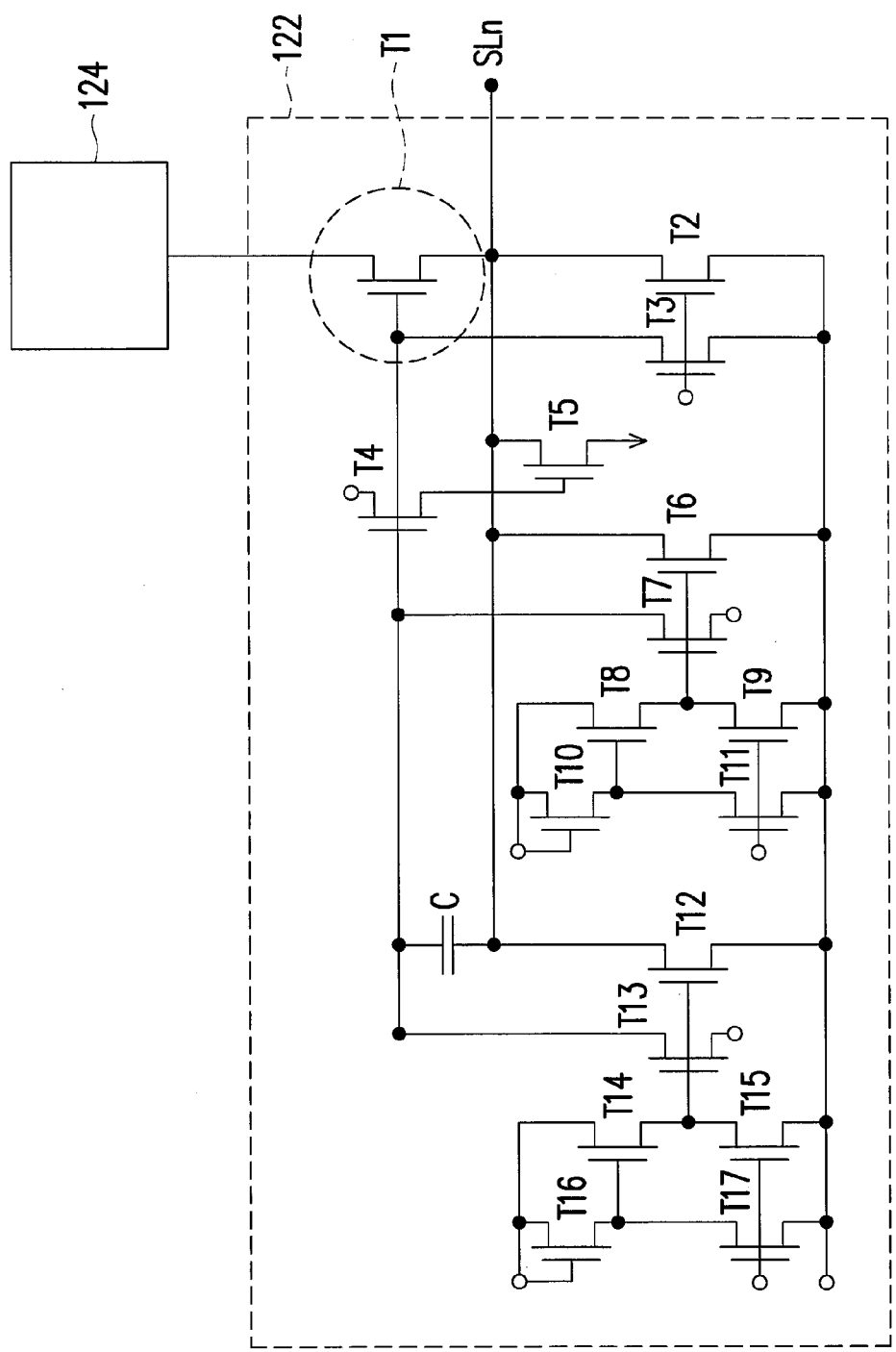
FIG. 2 is an equivalent circuit diagram of a gate driving unit in FIG. 1.

FIG. 2 is an equivalent circuit diagram of a gate driving unit in FIG. 1. Referring to FIG. 2, the gate driving unit 122 includes a plurality of active devices T1-T17 and at least one capacitor C. The gate driving unit 122 is configured to drive the pixel array 110. In particular, the active device T1 in the gate driving unit 122 is electrically connected between the chip 124 and the scan line SLn. Thus, the active device T1 is the one in the gate driving unit 122 closest to the pixel array 110 and suffers the largest current and the largest stress effect. The structure of the active device T1 is described as following.

The First Embodiment

Figure 3:
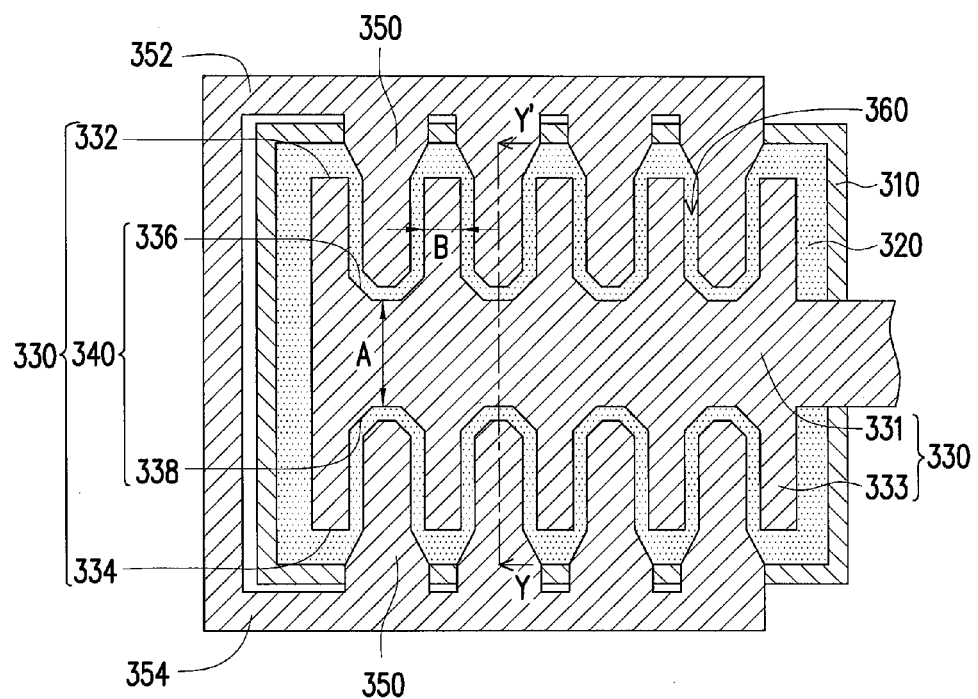
FIG. 3 is a top-view diagram of a display panel in a gate driving circuit according to the first embodiment of the invention.
Figure 4:
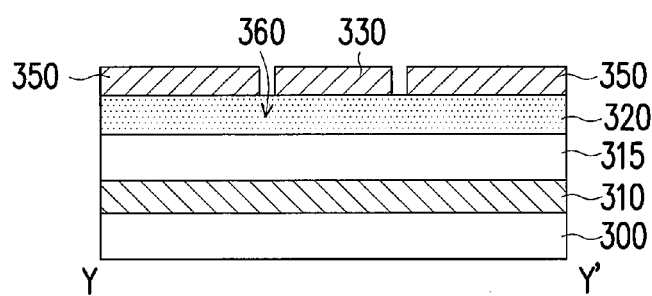
FIG. 4 is a cross-sectional diagram of FIG. 3 along line Y-Y'.

FIG. 3 is a top-view diagram of a display panel in a gate driving circuit according to the first embodiment of the invention and FIG. 4 is a cross-sectional diagram of FIG. 3 along line Y-Y'. Referring to FIGS. 2-4, the active device T1 includes a gate 310, a semiconductor layer 320, a first source 330 and a plurality of drains 350. The gate 310 is disposed on a substrate 300 and the material of the gate 310 is, for example, metal, metal oxide or metal nitride. The gate 310 of the active device T1 is electrically connected to one terminal of the capacitor C. The semiconductor layer 320 is disposed over the gate 310, and the material of the semiconductor layer 320 is, for example, amorphous silicon, polysilicon, metal-oxide semiconductor or other semiconductor materials. An insulation layer 315 can be disposed between the semiconductor layer 320 and the gate 310. The first drains 350 and the first source 330 are disposed on the semiconductor layer 320 and are made of, for example, metal, metal oxide or metal nitride. The first source 330 is electrically connected to a terminal of the capacitor C. The first drains 350 are electrically connected to the chip 124. Since the first drains 350 of the active device T1 are electrically connected to the chip 124 and the first source 330 is electrically connected to the scan line SLn, the active device T1 is electrically connected between the chip 124 and the scan line SLn so as to transmit the signal from the chip 124 (for example, a current) to the scan line SLn. In addition, a channel region 360 is formed between the first drain 350 and the first source 330.

In more details, as shown by FIG. 3, the first source 330 includes a first side 332 and a second side 334 disposed opposite to each other, wherein the first side 332 and the second side 334 are parallel to each other. The first side 332 has a plurality of first recesses 336 and the second side 334 has a plurality of second recesses 338, where the first recesses 336 and the second recesses 338 are substantially the same as each other except that the layout directions of the first recesses 336 and the second recesses 338 are different from each other. In other words, once the first recesses 336 are respectively clockwise turned by 180°, the turned first recesses 336 and the second recesses 338 can be substantially the same as each other. Although each of the first recesses 336 and each of the second recesses 338 is horseshoe-shaped or U-shaped, but the invention is not limited thereto. Each of the first recesses 336 and each of the second recesses 338 are disposed opposite to each other to constitute a recess-pair 340; i.e., each of the first recesses 336 and each of the second recesses 338 clockwise turned by 180° constitute a recess-pair 340, and the minimum distance between the first recess 336 and the second recess 338 of each recess-pair 340 is A and the minimum distance between two neighboring recess-pairs 340 is B, in which A is greater than B. The first source 330 includes a first trunk 331 and a plurality of first branches 333, and the first branches 333 are respectively located at the two sides of the first trunk 331 to form the first recesses 336 and the second recesses 338. The width of the first trunk 331 is A, the width of each of the first branches is B, and A is greater than B. In addition, the ratio of A and B (A/B) is at least greater than 1. In this embodiment, the ratio of A and B (A/B) is greater than 2.

The first drains 350 can be electrically connected to each other through the drain lines 352 and 354 and electrically connected to the chip 124. Each of the first drains 350 is correspondingly disposed in one of the first recesses 336 or one of the second recesses 338 of the first source 330. In the embodiment, since the first side 332 and the second side 334 are parallel to each other, the first recesses 336 and the second recesses 338 are parallel to each other as well, and at the time, the integral layout of the active device T1 is substantially present as an upright rectangle. In other words, since the drain lines 352 and 354 connected to the first drains 350 are parallel to each other, the corresponding gate 310 and the upper and lower sides of the semiconductor layer 320 are parallel to each other, so that the gate 310, the upper and lower sides of the semiconductor layer 320 and the left and right sides of the semiconductor layer 320 together form an upright rectangle and thereby the integral layout of the active device T1 is substantially present as an upright rectangle.

In short, since the first drains 350 of the active device T1 are connected to the chip 124 and the first source 330 is electrically connected to the scan line SLn, when the active device T1 receives the signal from the chip 124 (for example, a current), the most current to be transmitted to the scan line SLn is input to the first trunk 331 of the first source 330 through the first drains 350. In this embodiment, since the width A of the first trunk 331 of the first source 330 is greater than the width B of each of the first branches 330, the current is input to the scan line SLn through the first trunk 331 with the greater width and the current density inside the active device T1 is reduced. Accordingly, the stress effect and the thermal effect of the active device T1 can be reduced.

The Second Embodiment

Figure 5:
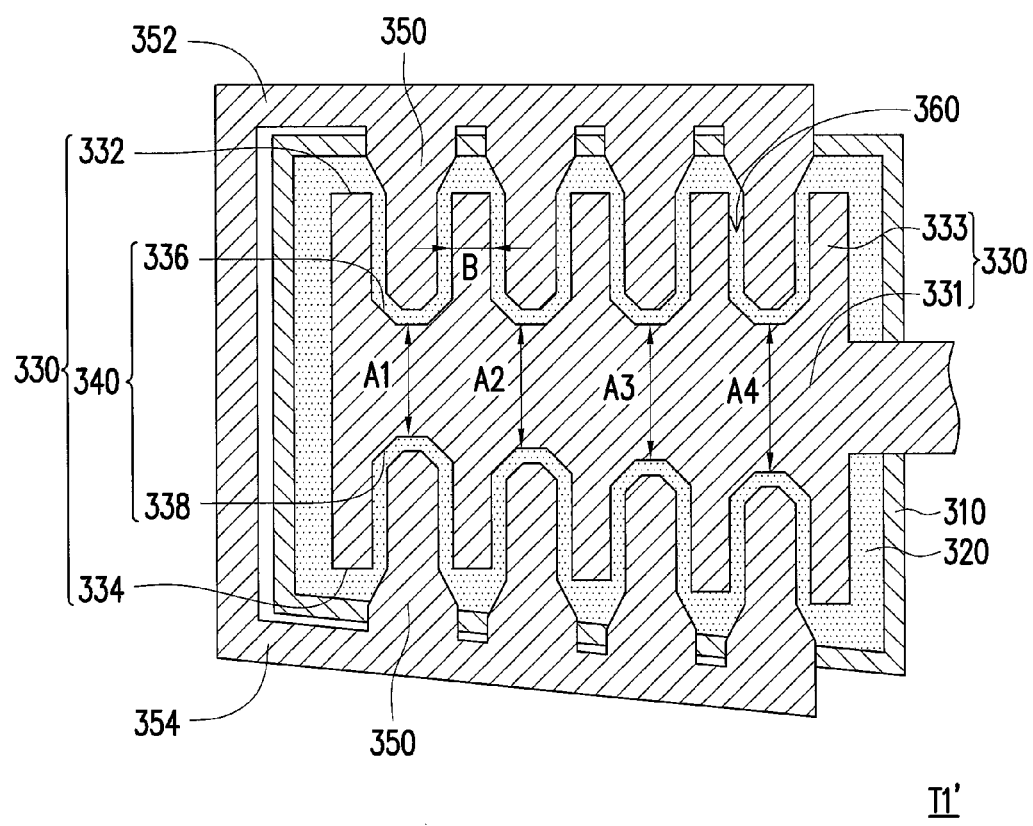
FIG. 5 is a top-view diagram of a display panel in a gate driving circuit according to the second embodiment of the invention.

FIG. 5 is a top-view diagram of a display panel in a gate driving circuit according to the second embodiment of the invention. Referring to FIG. 5, in the embodiment of FIG. 5 and the embodiment of FIG. 3, the same elements are represented with the same notations, and the descriptions related to the elements are omitted. The difference between the embodiment of FIG. 5 and the embodiment of FIG. 3 rests in that the first side 332 and the second side 334 of the active device T1' in FIG. 5 are not parallel to each other. Assuming the minimum distances between the first recesses 336 and the second recesses 338 of each recess-pair 340 in the first source 330 are respectively A1, A2, A3 and A4, these minimum distances A1-A4 are different from each other. For example, A1-A4 can take on ascending aspect, i.e., A4>A3>A2>A1. A minimum distance between two neighboring recess-pairs is B, wherein A1 is greater than B, and therefore A4>A3>A2>A1>B. The first source 330 and the first drains 350 of the active device T1' together constitute a trapezoidal pattern, so that the integral layout of the active device T1' is a trapezoidal pattern. In other words, in the active device T1' of FIG. 5, since the drain lines 352 and 354 connecting the first drains 350 are not parallel to each other, the upper and lower sides of the corresponding gate 310 and the semiconductor layer are not parallel to each other as well. The upper and lower sides of the gate 310 and the semiconductor layer 320 not parallel to each other and the left and right sides thereof parallel to each other can together constitute a trapezoidal pattern so that the integral layout of the active device T1' is substantially present as a trapezoidal pattern.

It should be noted that although only four recess-pairs 340 are shown in FIG. 5, but the invention is not limited thereto. The first source 330 of the invention can have N recess-pairs 340, the minimum distance between the first recess and the second recess of the $1^{st}$ recess-pair is A1, and the minimum distance between the first recess 336 and the second recess 338 of the $N^{th}$ set of recess-pairs 340 is An. The minimum distances A1-An are different from each other and take on ascending aspect, i.e., A1>B, therefore An>An−1>A1>B. On the other hand, the first trunk 331 of the first source 330 can have various widths A1-An, wherein A1-An are respectively the minimum distance between the first recess 336 and the second recess 338 of the $1^{st}$ through the $N^{th}$ recess-pairs 340. A1 to An are different from each other and take on ascending aspect, and A1>B, so that An>An−1>A1>B. For example, if the first source 330 has the shape as shown by FIG. 5, the first trunk 331 have various widths A1-An, and An>An−1>A1>B. At this time, the first drains 350 and the first source 330 disposed in the first recesses 336 and the second recesses 338 can constitute a trapezoidal pattern.

In the embodiment, since the first side 332 and the second side 334 of the first source 330 are not parallel to each other, the first source 330 and the first drains 350 together constitute a first trapezoidal pattern. Accordingly, the integral layout of the active device T1' is a trapezoidal pattern.

The Third Embodiment

Figure 6:
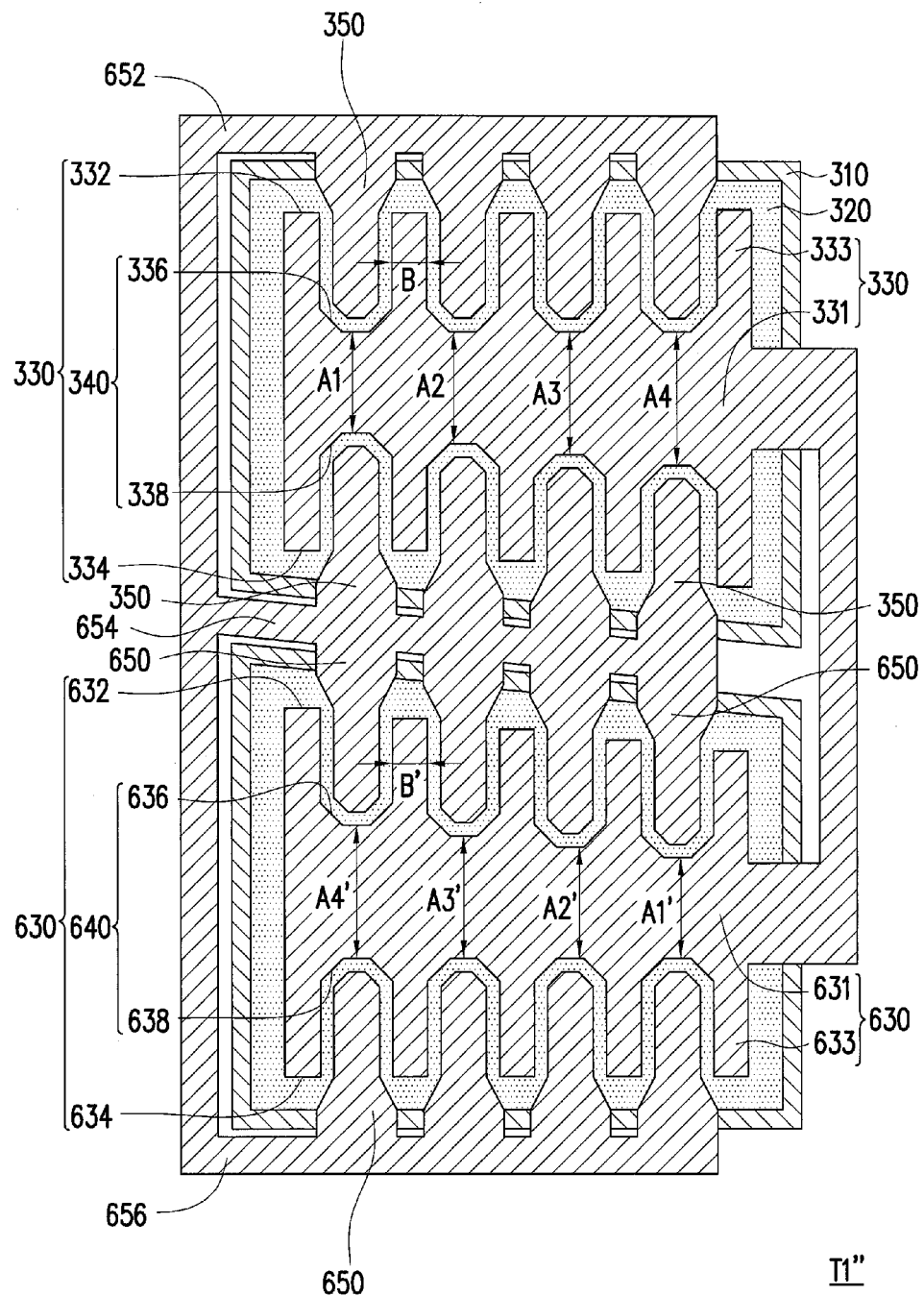
FIG. 6 is a top-view diagram of a display panel in a gate driving circuit according to the third embodiment of the invention.

FIG. 6 is a top-view diagram of a display panel in a gate driving circuit according to the third embodiment of the invention. In the embodiment of FIG. 5 and the embodiment of FIG. 6, the same elements are represented with the same notations, and the descriptions related to the elements are omitted. The difference between the embodiment of FIG. 6 and the embodiment of FIG. 5 rests in that active device T1" further includes a second source 630 and a plurality of second drains 650. The second source 630 is electrically connected to the first source 330, the second source 630 and the first source 330 are electrically connected to each other, and the second source 630 and the first source 330 can be electrically connected to a same scan line SLn. The second source 630 includes a plurality of recess-pairs 640 and each of the recess-pairs 640 has a first recess 636 and a second recess 638 disposed opposite to each other. In the second source 630, the minimum distance between the first recess 636 and the second recess 638 of each recess-pair 640 is A', and the minimum distance between two neighboring recess-pairs 640 is B', wherein A' is greater than B'. In other words, the second source 630 includes a second trunk 631 and a plurality of second branches 633, and the second branches 633 are respectively disposed at the two sides of the second trunk 631 to form the first recesses 636 and the second recesses 638. The width of the second trunk 631 is A' and the width of each of the second branches 633 is B', and A' is greater than B'.

In this embodiment, the first side 632 and the second side 634 of the second source 630 are not parallel to each other. Assuming the minimum distances between the first recesses 636 and the second recesses 638 of the recess-pairs 640 in the second source 630 are respectively A'1, A'2, A'3 and A'4, these minimum distances A'1-A'4 are different from each other. A'1-A'4 can take on ascending aspect, i.e., A'4>A'3>A'>A'1. A minimum distance between two neighboring recess-pairs 640 is B' in the second source 630, wherein A' is greater than B' and thus, A'4>A'3>A'2>A'1>B'. In this case, the first source 330 and the first drains 350 of the active device T1" together constitute a first trapezoidal pattern, the second source 630 and the second drains 650 together constitute a second trapezoidal pattern and the first trapezoidal pattern and the second trapezoidal pattern together constitute a rectangular pattern. Accordingly, the integral layout of the active device T1" is a rectangular pattern. In other words, in the active device T1" of FIG. 6, since the drain lines 652 and 654 connecting the first drains 350 are not parallel to each other, the corresponding gate 310 and the semiconductor layer 320 can together constitute a first trapezoidal pattern. In addition, since the drain lines 652 and 654 connecting the second drains 650 are not parallel to each other, the corresponding gate 310 and the semiconductor layer 320 can together constitute a second trapezoidal pattern. The first trapezoidal pattern and the second trapezoidal pattern are respectively located at the two sides of the drain lines 654 to constitute a rectangular pattern so that the integral layout of the active device T1" is a rectangular pattern.

It should be noted that although only four recess-pairs 640 are shown in FIG. 6, but the invention is not limited thereto. The second source 630 of the invention can have N recess-pairs 640, the minimum distance between the first recess 336 and the second recess 338 of the $1^{st}$ recess-pair 640 is A'1, and the minimum distance between the first recess 336 and the second recess 338 of the $N^{th}$ recess-pair 640 is A'n. The minimum distances A'1-A'n are different from each other and take on ascending aspect, i.e., A'n>A'n−1>A'1>B'.

In other hand, the second trunk 631 of the second source 630 can have various widths A'1-A'n, wherein A'1-A'n are respectively the minimum distance between the first recess 636 and the second recess 638 of the $1^{st}$ through the $N^{th}$ recess-pairs 640. A'1 to A'n are different from each other and take on ascending aspect, thus, A'n>A'n−1>A'1 . . . . In addition, the second branches 633 of the second source can have the width B', wherein A' is greater than B', and thus, A'n>A'n−1>A'1>B'.

The first drains 350 are electrically connected to each other through the drain lines 652 and 654 and the second drains 650 are electrically connected to each other through the drain lines 654 and 656, so that the first drains 350 and the second drains 650 are electrically connected to each other. Each of the first drains 350 is correspondingly disposed in one of the first recesses 336 or one of the second recesses 338 of the first drains 350, and each of the second drains 650 is correspondingly disposed in one of the first recesses 636 or one of the second recesses 638 of the second source 630.

In the embodiment, since the first side 632 and the second side 634 of the second source 630 are not parallel to each other, the second source 630 and the second drains 650 together constitute a second trapezoidal pattern. The second trapezoidal pattern and the first trapezoidal pattern composed of the first source 330 and the first drains 350 together constitute a rectangular pattern so that the integral layout of the active device T1" is a rectangular pattern.

The advantage of the active device in this invention is further explained through an experimental example and a comparison example.

EXPERIMENTAL EXAMPLE

Figure 7:
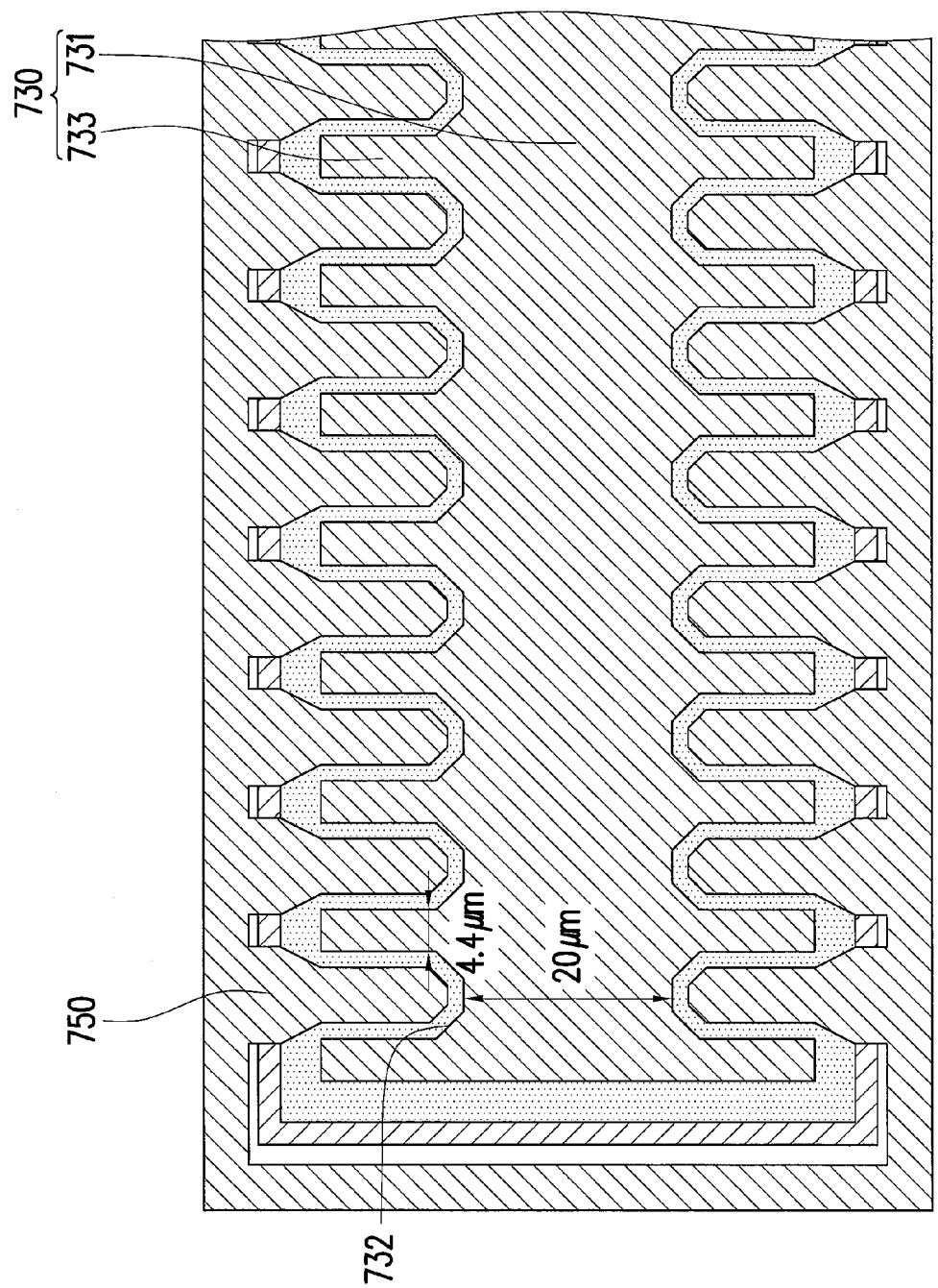
FIG. 7 is a schematic diagram of an active device in an embodiment of the invention.

FIG. 7 is a schematic diagram of an active device in an embodiment of the invention. Referring to FIG. 7, the width of a trunk 731 of the source 730 in the active device 700 is 20 μm and the width of each of the branches 733 is 4.4 μm. There are ten recesses 732 disposed at each of the two sides of the source 730 in the active device 700, and each one of the drains 750 is respectively disposed in one of the recesses 732. As a result, the total area of the source 730 in the active device 700 and the drains 750 is about 6972 μm².

COMPARISON EXAMPLE

Figure 8:
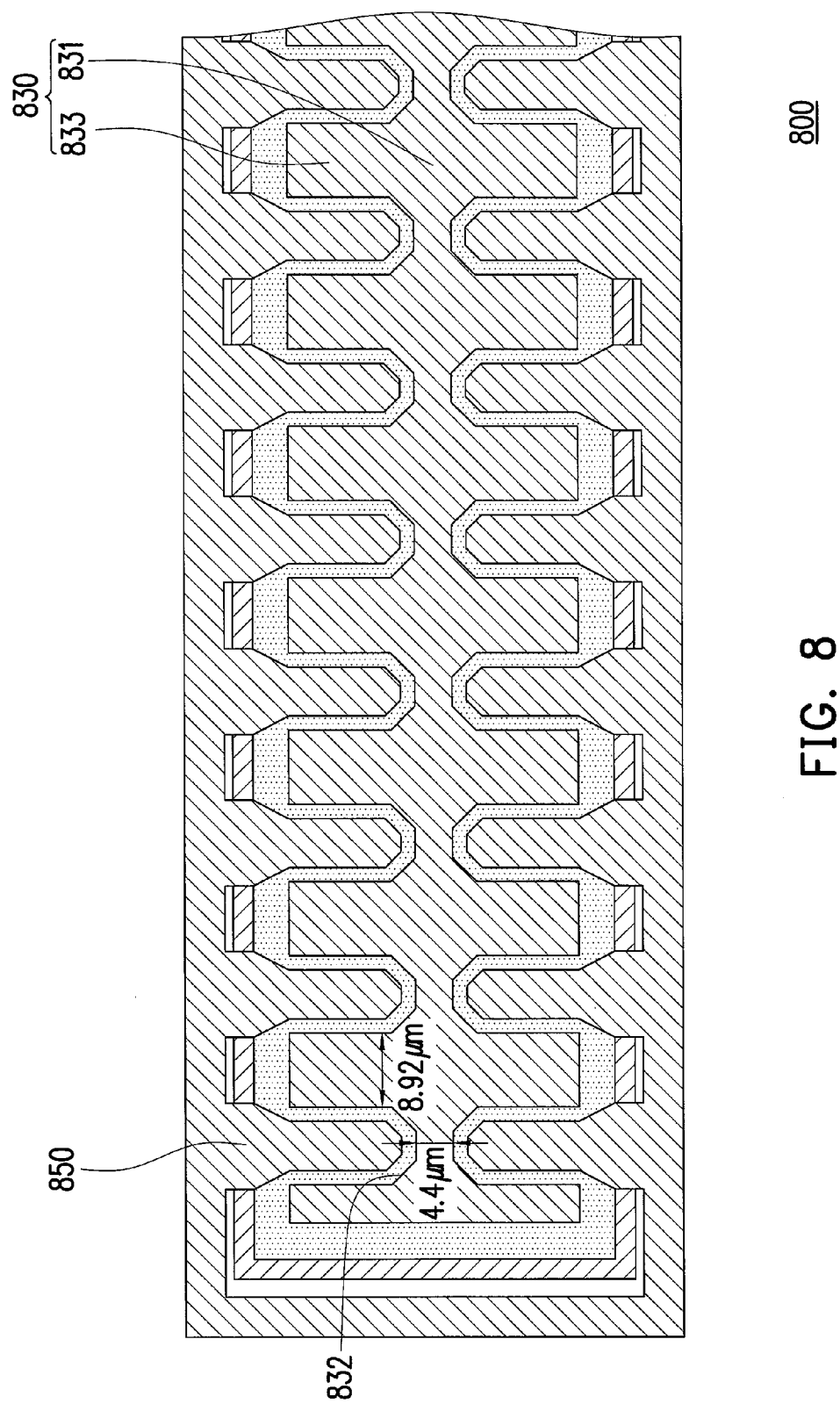
FIG. 8 is a schematic diagram of an active device in a comparison embodiment of the invention.

FIG. 8 is a schematic diagram of an active device in a comparison embodiment of the invention. Referring to FIG. 8, the width of a trunk 831 of the source 830 in the active device 800 is 4.4 μm and the width of each of the branches 833 is 8.92 μm. There are ten recesses 832 disposed at each of the two sides of the source 830 in the active device 800, and each one of the drains 850 is respectively disposed in one of the recesses 832. As a result, the total area of the source 830 in the active device 800 and the drains 850 is about 6970 μm².

<Area Evaluation>

It can be seen from the aforementioned depiction, although the width of the trunk of the source in the experimental example of this invention is 4.45 times of the comparison example, but the total areas of the source and the drains for the two examples are roughly equivalent to each other. In other words, the experimental example can effectively increase the width of the trunk of the drains substantially without increasing the total areas of the source and the drains, and further, when the active device of the invention is disposed in a driving circuit, it does not increase the total area of the entire driving circuit.

<Stress Effect Test and the Result Evaluation>

Figure 9:
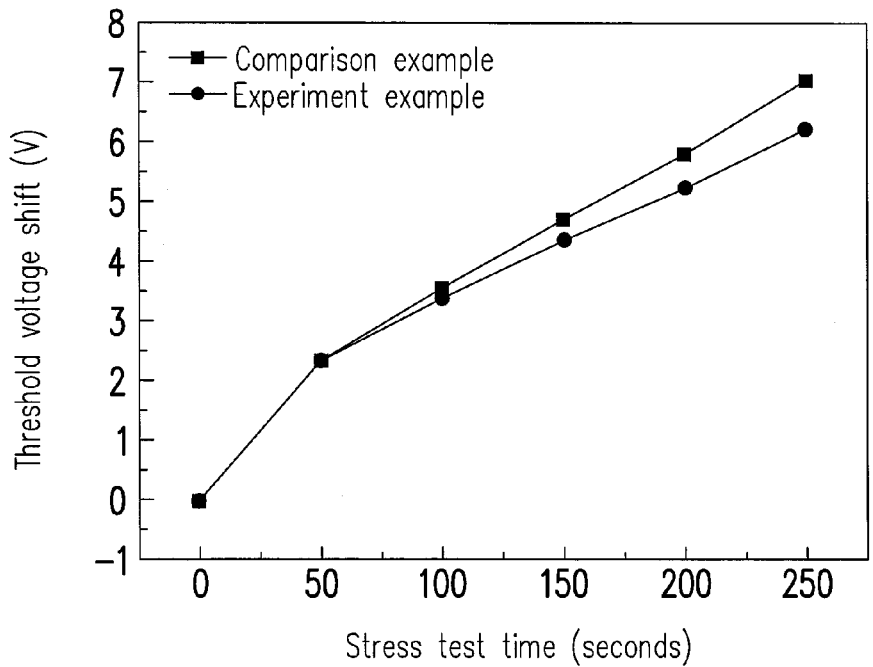
FIG. 9 illustrates threshold voltage shifts respectively for the experiment example of the invention and the comparison example after performing a stress effect test.
Figure 10:
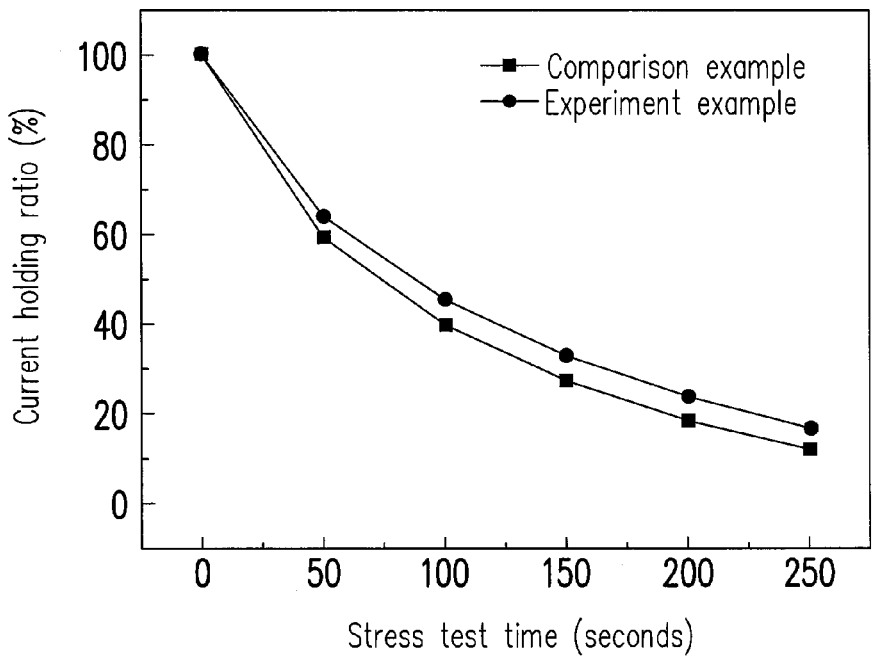
FIG. 10 illustrates current recession drops respectively for the experimental example of the invention and the comparison example after performing a stress effect test.

A stress effect test with a duration of 250 seconds is respectively on the active device of the active example and the active device of the comparison example by means of constant-current testing method, wherein the results are recorded as shown by FIGS. 9 and 10.

FIG. 9 illustrates threshold voltage shifts respectively for the experimental example of the invention and the comparison example after performing a stress effect test. Referring to FIG. 9, after the stress effect test with a duration of 250 seconds, the threshold voltage shift of the active device in the experiment example of the invention is roughly 6.24 V, which is less than the threshold voltage shift of the active device in the comparison example (roughly 7.06 V), so that it means that the active device of the experimental example has better stability.

FIG. 10 illustrates current recession drops respectively for the experimental example of the invention and the comparison example after performing a stress effect test. Referring to FIG. 10, after the stress effect test with a duration of 250 seconds, the current holding ratio of the active device in the experiment example under a gate voltage of 20 V is roughly 16.81% (i.e., the current recession drop rate is 83.19%), while the current holding ratio of the active device in the comparison example is roughly 12.06% (i.e., the current recession drop rate is 87.94%). In comparison with the comparison example, the active device of the experimental example has larger current holding ratio and smaller current recession drop rate, so that it means that the active device of the experimental example has better stability.

In summary, in the active device of the invention, when the current flows through a plurality of drains to be input to the source and arrives at the pixel array, the most current passes through the trunk of the source. The width of the trunk of the source in the active device of the invention is greater than the width of the branch, so that the density of the current flowing through the active device can be effectively reduced. Accordingly, the stress effect and the thermal effect of the display device is reduced and the stability and the lifetime of the active device are enhanced. In addition, by using the design of the active device of the invention can also effectively enhance the stability of the active device without increasing the area of the driving circuit.

It will be apparent to those skilled in the art that the descriptions above are several preferred embodiments of the present invention only, which does not limit the implementing range of the present invention. Various modifications and variations can be made to the structure of the present invention without departing from the scope or spirit of the invention. In view of the foregoing, the protective scope of the present invention is given by the following claims and their equivalents.

What is claimed is:

1. A display panel, comprising:
a pixel array; and
a driving circuit, electrically connected to the pixel array, wherein the driving circuit comprises at least one active device and the active device comprises:
a gate;
a semiconductor layer, disposed over the gate;
a first source, disposed on the semiconductor layer and comprising a first side and a second side opposite to each other, wherein the first side has a plurality of first recesses, the second side has a plurality of second recesses, each of the first recesses and a corresponding second recess are disposed opposite to each other to constitute a recess-pair, the first source has N recess-pairs, a minimum distance between the first recess and the second recess of the $1^{st}$ recess-pair is A1, a minimum distance between the first recess and the second recess of the $N^{th}$ recess-pair is An, a minimum distance between two neighboring recess-pairs is B, wherein A1-An are greater than B, and the minimum distances A1-An are different from each other; and a plurality of first drains, disposed on the semiconductor layer, wherein the first drains are electrically connected to each other, and each of the first drains is respectively disposed in one of the recesses of the first source.

2. The display panel as claimed in claim 1, wherein ratios of A1-An and B (A1/B to An/B) are greater than 2.

3. The display panel as claimed in claim 1, wherein the driving circuit further comprises a capacitor, a terminal of the capacitor is electrically connected to the first source and the other terminal of the capacitor is electrically connected to the gate.

4. The display panel as claimed in claim 1, further comprising a chip, and the active device of the driving circuit is electrically connected between the chip and the pixel array.

5. The display panel as claimed in claim 1, wherein the pixel array comprises a plurality of data lines, a plurality of scan lines and a plurality of pixel units, and the active device of the driving circuit is electrically connected to one of the scan lines.

6. The display panel as claimed in claim 1, wherein An>An-1>A1>B.

7. The display panel as claimed in claim 6, wherein the first source and the first drains together constitute a trapezoidal pattern.

8. The display panel as claimed in claim 6, wherein the active device further comprises:

a second source, disposed on the semiconductor layer and electrically connected to the first source, wherein the second source comprises a plurality of recess-pairs, each of the recess-pairs of the second source comprises a first recess and a second recess disposed opposite to each other, a minimum distance between the first recess and the second recess of each of the recess-pairs of the second source is A', a minimum distance between two neighboring recess-pairs of the second source is B', wherein A' is greater than B'; and a plurality of second drains, disposed on the semiconductor layer, wherein the second drains are electrically connected to each other, and each of the second drains is respectively disposed in one of the recesses of the second source.

9. The display panel as claimed in claim 8, wherein the second source has N recess-pairs, the minimum distance between the first recess and the second recess of the $1^{st}$ recess-pair is A'1, the minimum distance between the first recess and the second recess of the $N^{th}$ recess-pair of the second source is A'n, and the minimum distances A'1-A'n are different from each other.

10. The display panel as claimed in claim 9, wherein A'n>A'n−1>A'1>B'.

11. The display panel as claimed in claim 10, wherein the first source and the first drains together constitute a first trapezoidal pattern, the second source and the second drains together constitute a second trapezoidal pattern, and the first trapezoidal pattern and the second trapezoidal pattern together constitute a rectangular pattern.

12. An active device, comprising:

a gate;

a semiconductor layer, disposed over the gate;

a first source, disposed on the semiconductor layer and comprising:

a first trunk, the first trunk has a plurality of widths A1-An; and a plurality of first branches, respectively disposed at two sides of the first trunk to form a plurality of recesses, wherein width of each the first branch is B, and An>An-1>A1>B; and a plurality of first drains, disposed on the semiconductor layer, wherein the first drains are electrically connected to each other, and each of the first drains is respectively disposed in one of the recesses of the first source.

13. The active device as claimed in claim 12, wherein ratios of A1-An and B (A1/B to An/B) are greater than 2.

14. The active device as claimed in claim 12, wherein the first source and the first drains together constitute a trapezoidal pattern.

15. The active device as claimed in claim 12, further comprising:

a second source, disposed on the semiconductor layer and electrically connected to the first source, wherein the second source comprises:

a second trunk; and a plurality of second branches, respectively disposed at two sides of the second trunk to fond a plurality of recesses, wherein width of the second trunk is A', width of each the second branch is B', and A' is greater than B'; and a plurality of second drains, disposed on the semiconductor layer, wherein the second drains are electrically connected to each other, and each of the second drains is respectively disposed in one of the recesses of the second source.

16. The active device as claimed in claim 15, wherein the second trunk has a plurality of widths A'a-A'n, wherein A'n>>A'n−1>A'1>B'.

17. The active device as claimed in claim 16, wherein the first source and the first drains together constitute a first trapezoidal pattern, the second source and the second drains together constitute a second trapezoidal pattern, and the first trapezoidal pattern and the second trapezoidal pattern together constitute a rectangular pattern.

* * * * *